United States Patent
Li et al.

(10) Patent No.: US 11,043,917 B2
(45) Date of Patent: Jun. 22, 2021

(54) OPTOELECTRONIC OSCILLATOR (71) Applicant: INSTITUTE OF SEMICONDUCTORS, CHINESE ACADEMY OF SCIENCES, Beijing (CN)

(72) Inventors: Ming Li, Beijing (CN); Dapeng Liu, Beijing (CN); Nuannuan Shi, Beijing (CN); Tengfei Hao, Beijing (CN); Ninghua Zhu, Beijing (CN)

(73) Assignee: INSTITUTE OF SEMICONDUCTORS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/930,089

(22) Filed: May 12, 2020

(65) Prior Publication Data
US 2020/0366242 A1 Nov. 19, 2020

(30) Foreign Application Priority Data

May 14, 2019 (CN) .......................... 201910400701.7

(51) Int. Cl.
*H03B 17/00* (2006.01)
*H01P 1/20* (2006.01)
(Continued)

(52) U.S. Cl.
CPC .............. *H03B 17/00* (2013.01); *H01P 1/20* (2013.01); *H01S 5/0085* (2013.01);
(Continued)

(58) Field of Classification Search
CPC ....................................................... H03B 17/00
(Continued)

(56) References Cited

U.S. PATENT DOCUMENTS

| 8,804,231 | B2 * | 8/2014 | Savchenkov | ......... | H01S 3/1304 |
| | | | | | 359/337.1 |
| 8,976,822 | B2 * | 3/2015 | Maleki | .................. | H01S 5/0656 |
| | | | | | 372/20 |
| 2012/0327497 | A1 * | 12/2012 | Matsko | ................. | G02F 1/0123 |
| | | | | | 359/239 |

FOREIGN PATENT DOCUMENTS

| CN | 105207057 | 12/2015 |
| CN | 108183380 | 6/2018 |

OTHER PUBLICATIONS

First Chinese Office Action, issued in the corresponding Chinese application No. 201910400701.7, dated Mar. 4, 2020, 14 pages.

* cited by examiner

*Primary Examiner* — Joseph Chang
(74) *Attorney, Agent, or Firm* — Hamre, Schumann, Mueller & Larson, P.C.

(57) ABSTRACT

Embodiments of the present disclosure disclose an optoelectronic oscillator including an optical chip and a microwave chip. The optical chip is implemented by fabricating different optoelectronic devices on an integrated optical substrate, comprising: a laser assembly; a mode selection device coupled to the laser assembly, and configured to receive the laser and perform mode selection; an optical delay module coupled to the mode selection device; and a detector coupled to the optical delay module. The microwave chip is a microwave integrated circuit formed by fabricating microwave elements on a semiconductor substrate, comprising: a microwave processing circuit configured to receive microwave signal and perform signal processing; a coupler coupled to the microwave processing circuit, and configured to provide a part of the microwave signal to a phase shifter and output the other part thereof; and a phase shifter
(Continued)

configured to feed the phase-shifted microwave signal to the laser assembly.

15 Claims, 5 Drawing Sheets

(51) Int. Cl.
  *H01S 5/00* (2006.01)
  *H01S 5/02* (2006.01)
  *H01S 5/12* (2021.01)
  *H03F 3/189* (2006.01)
(52) U.S. Cl.
  CPC .............. *H01S 5/0206* (2013.01); *H01S 5/12* (2013.01); *H03F 3/189* (2013.01); *H03B 2200/0044* (2013.01)
(58) Field of Classification Search
  USPC .......................................................... 331/66
  See application file for complete search history.

OPTOELECTRONIC OSCILLATOR

CROSS-REFERENCE TO RELATED APPLICATION(S)

This application claims the priority of Chinese Patent Application No. 201910400701.7 filed on May 14, 2019, the entire contents of which are hereby incorporated by reference.

TECHNICAL FIELD

The disclosure relates to the field of integrated microwave photonics technologies, and in particular, to a low phase-noise, tunable and hybrid integrated optoelectronic oscillator.

BACKGROUND

Microwave photonic technology is considered to be one of the crucial technologies to solve the rate and capacity bottleneck of the current information networks since it has the advantage of being flexible similar to the electronic technology, and the advantage of being broadband, reconfigurable and anti-interference similar to the photonic technology. Microwave signal with a low phase noise is widely applied in military fields such as radar systems, so the generation of high-purity microwave signal has always been the focus of microwave photonics. A high-quality microwave signal can be generated by an optoelectronic oscillator. The phase noise of the military optoelectronic oscillator could reach as low as −140 dBc/Hz@10 kHz. In recent years, optoelectronic oscillators gain much attention from research institutions.

Conventional optoelectronic oscillators mainly consist of discrete devices such as a laser, a long optical fiber, a modulator, a detector and a filter. Although high-quality microwave signal can be generated, generally, large size and weight block the further applications. Further, they are susceptible to external environments such as vibration and temperature. Besides, the conventional optoelectronic oscillators are challenging to operate continuously and stably in complex environments such as a battlefield. Moreover, the use of multiple discrete devices would improve the cost and the requirements on the power supply system, casing them bulky, heavy, costly and unstable.

Therefore, there is a need for small, lightweight, stable and tunable optoelectronic oscillators, which are capable of generating microwave signal with a low phase noise.

SUMMARY

In view of this, an object of the present disclosure is to provide an optoelectronic oscillator that at least partially solves at least one of the above technical problems.

According to an aspect of the present disclosure, there is provided an optoelectronic oscillator including an optical chip and a microwave chip. The optical chip is implemented by fabricating different optoelectronic devices on an integrated optical material substrate. The optoelectronic device comprises: a laser assembly configured to emit a laser; a mode selection device coupled to the laser assembly, configured to receive the laser from the laser assembly, and perform mode selection on the laser; an optical delay module coupled to the mode selection device, and configured to receive a mode selected light from the mode selection device so as to store the energy of light; and a detector coupled to the optical delay module and configured to receive the stored light form the optical delay module and generate microwave signal according to the stored light received. The microwave chip is implemented by fabricating microwave elements on a semiconductor material substrate, the microwave elements comprise: a microwave processing circuit configured to receive the microwave signal from the detector and process the microwave signal; a coupler coupled to the microwave processing circuit, and configured to receive a processed microwave signal from the microwave processing circuit, provide a part of the processed microwave signal to a phase shifter and output the other part of the processed microwave signal; and the phase shifter coupled to the coupler, and configured to receive and phase-shift the part of the processed microwave signal from the coupler, and feed a phase-shifted microwave signal to the laser assembly, so as to modulate the laser emitted by the laser assembly.

In an example, the optical delay module is a waveguide spiral, having a length longer than 2 m.

In another example, the length of the waveguide spiral is 3 m.

In another example, the laser assembly is implemented as a laser equipped with a microwave interface, which is configured to receive the phase-shifted microwave signal, and modulate the laser output according to the phase-shifted microwave signal.

In another example, the laser assembly is implemented as a laser and a modulator coupled to the laser, the modulator is configured to receive the phase-shifted microwave signal from the coupler, and modulate the output of the laser according to the phase-shifted microwave signal.

In another example, the laser is a distributed feedback laser.

In another example, the distributed feedback laser has a single mode output with a wavelength of 1550 nm, and the wavelength can be tuned with a range of 4 nm under the injection current.

In another example, the integrated optical material substrate comprises an active substrate, and wherein the laser assembly, the mode selection device, the optical delay module and the detector are fabricated on the active substrate.

In another example, the integrated optical material substrate comprises an active substrate and a passive substrate, and wherein the laser assembly and the detector are fabricated on the active substrate, and the mode selection device and the optical delay module are fabricated on the passive substrate.

In another example, the active substrate is an indium phosphide substrate.

In another example, the passive substrate is a silicon nitride substrate.

In another example, the optoelectronic oscillator further comprises a spot-size converter fabricated on the active substrate, and configured to perform a spot-size conversion between different substrates.

In another example, the optoelectronic oscillator further comprises a microstrip line, and wherein the microwave chip is connected to the optical chip through the microstrip line.

In another example, the microwave processing circuit comprises a microwave filter and a microwave amplifier, wherein the microwave filter is configured to filter the microwave signal and the microwave amplifier is configured to amplify the microwave signal.

In another example, the mode selection device comprises one of a high-Q resonant cavity and a grating.

DETAILED DESCRIPTION

In order to make objectives, features and advantages of the present disclosure more clearly, the present disclosure will be described in detail below with reference to the accompanying drawings and specific embodiments.

Figure 1:
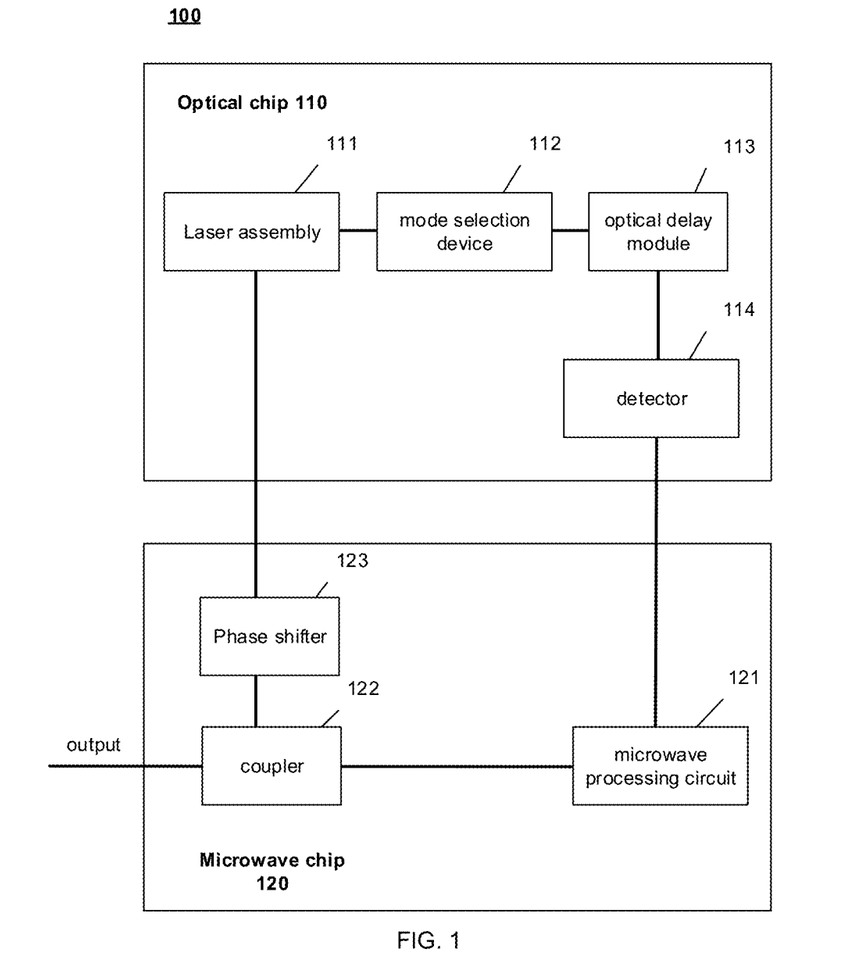
FIG. 1 is a structural block diagram of an optoelectronic oscillator in accordance with an example embodiment of the present disclosure.

FIG. 1 illustrates a structural block diagram of an optoelectronic oscillator in accordance with an example embodiment of the present disclosure.

The present disclosure proposes a low phase-noise, tunable and hybrid integrated optoelectronic oscillator 100. As shown in FIG. 1, the optoelectronic oscillator 100 may include an optical chip 110 and a microwave chip 120. The optical chip 110 is implemented by fabricating different optoelectronic devices on an integrated optical material substrate, the optoelectronic device comprises a laser assembly 111, a mode selection device 112, an optical delay module 113 and a detector 114. In particular, an output of the laser assembly 111, i.e. a laser is transmitted to the mode selection device 112 for mode selection, so as to generate a mode selected light. The mode selected light is transmitted to the optical delay module 113 for energy storage. Thus, the light is stored in the optical delay module. Then, the stored light is transmitted to the detector 114. The detector 114 receives and detects the stored light, generates a microwave signal based on the stored light received and transmits the microwave signal to the microwave chip 120. The microwave chip 120 may be implemented by fabricating microwave elements on a semiconductor material substrate. The microwave elements comprise a microwave processing circuit 121, a coupler 122 and a phase shifter 123. The microwave signal generated by the detector 114 is processed by the microwave processing circuit 121. The processed microwave signal is then divided into two parts via the coupler 122, one of which is phase-shifted by the phase shifter 123 and fed to the laser assembly 111 for modulating the laser emitted by the laser assembly 111, and the other part is coupled out via the coupler 122, achieving a low phase-noise and tunable microwave output.

The optical chip 110 may be implemented on an active substrate, such as an indium phosphide substrate. Then, the laser component 111, the mode selection device 112, the optical delay module 113, and the detector 114 may each be fabricated on the active substrate such as the indium phosphide substrate, and a communication waveguide may exist between the above described optoelectronic devices, such as a passive waveguide.

The laser assembly 111 can be any waveguide laser assemblies capable of receiving microwave signal. For example, the laser assembly 111 may be implemented as a laser equipped with a microwave interface. At this time, the microwave interface is configured to receive a phase-shifted microwave signal from the coupler 123, and modulate the output of the laser according to the phase-shifted microwave signal. As another example, the laser assembly 111 is also implemented as a laser and a modulator coupled to the laser. In this case, the modulator is configured to receive the phase-shifted microwave signal from the coupler 123, and modulate the output of the laser according to the phase-shifted microwave signal. Then, the laser may be a distributed feedback laser. The distributed feedback laser has a single mode output with a wavelength of 1550 nm, wherein the wavelength can be tuned with a range of 4 nm under the injection current.

The laser output from the laser assembly 111 may be transmitted to the mode selection device 112 for mode selection, so as to generate a mode selected light. The mode selection device 112 may be an optical device with a mode selection capability, such as a high-Q resonant cavity, a grating and the like. In one example, a high-Q resonant cavity with a Q value up to about $10^7$ and a free spectral range greater than 40 GHz may be employed as the mode selection device 112.

The mode selected light is transmitted to the optical delay module 113 for maximum energy storage. Specifically, the optical delay module 113 may be implemented as a waveguide spiral. More specifically, the waveguide spiral may have a relatively long length, thereby replacing the long optical fiber in the conventional optoelectronic oscillator and improving the stability. In one example, the length of the waveguide spiral is preferably longer than 2 m. More preferably, the length of the waveguide spiral is 3 m. Furthermore, the waveguide spiral may have a variety of shapes, such as a circular, a square, a triangular or any other shape. By designing a waveguide optical delay module with a long length according to the present disclosure, it is possible to obtain a low phase-noise microwave signal.

Moreover, the microwave chip 120 may be implemented on a microwave substrate such as a gallium arsenide substrate. In this case, the microwave processing circuit 121, the coupler 122, and the phase shifter 123 may each be fabricated on the gallium arsenide substrate. It should be noted that the microwave substrate may be an active microwave substrate and/or a passive microwave substrate, depending on design requirements. Further, the microwave chip 120 may be connected to the optical chip 110 through a microstrip line. In one example, the microwave processing circuit 121 may comprise elements such as a microwave filter and a microwave amplifier. In this case, the processing refers to filtering performed by the microwave filter and amplification performed by the microwave amplifier.

As described above, the optoelectronic oscillator according to an example embodiment of the present disclosure may realize a hybrid integrated optoelectronic oscillator by fabricates integrated optoelectronic devices on the integrated optical material substrate and fabricates microwave devices on the semiconductor material substrate, thereby enabling a resulting optoelectronic oscillator to achieve the benefits of a small size, a light weight and a high stability. Furthermore, the optoelectronic oscillator according to an example embodiment of the present disclosure may achieve a low phase-noise and tunable microwave signal output by fabricating the waveguide spiral with a long length and the mode selection device and feeding the generated microwave signal to the laser assembly for feedback.

Figure 2A:
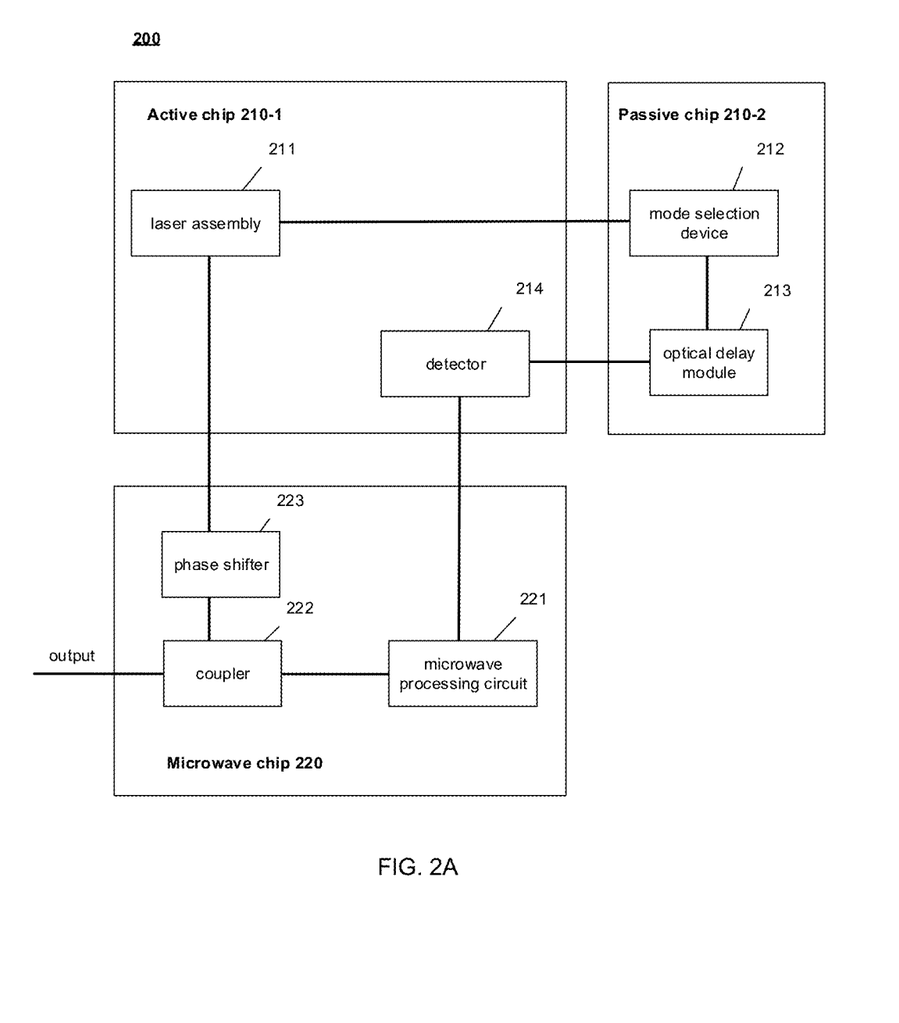
FIGS. 2A and 2B are structural block diagrams of optoelectronic oscillators in accordance with example embodiments of the present disclosure.
Figure 2B:
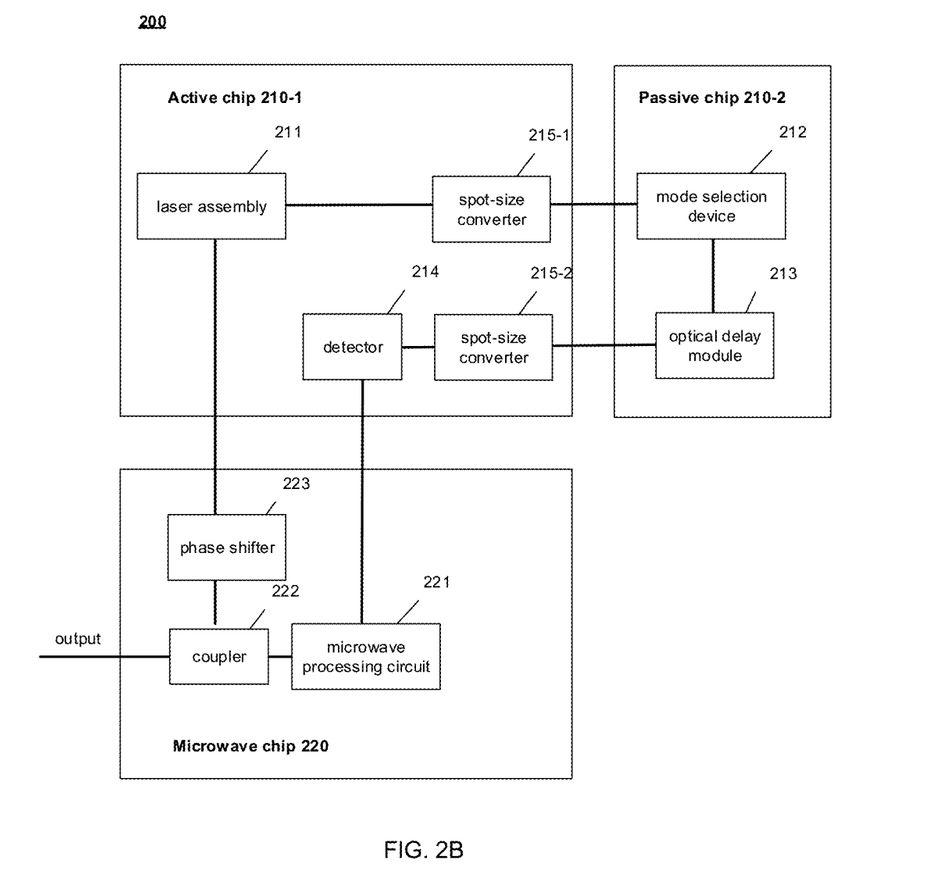

FIGS. 2A and 2B illustrate structural block diagrams of optoelectronic oscillators in accordance with example embodiments of the present disclosure.

The structure of the optoelectronic oscillator 200 as shown in FIG. 2A is similar to that of the optoelectronic oscillator 100 as shown in FIG. 1. Therefore, like reference numerals are used to refer to the same or similar elements. It should be noted that the difference between the optoelectronic oscillator 200 and the optoelectronic oscillator 100 is in that the optical chip 210 may include an active chip 210-1 and a passive chip 210-2 both. The active chip 210-1 may be implemented on an active substrate (e.g, an indium phosphide substrate) and the passive chip 210-2 may be implemented on a passive substrate (e.g, a silicon nitride substrate). At this time, a laser assembly 211 and a detector 214 can be fabricated on the active substrate, and a mode selection device 212 and an optical delay module 213 can be fabricated on the passive substrate. Since the waveguide fabricated on the active substrate has a large absorptivity for signal light, fabricating the optical delay module with a long length on the active substrate may cause a low efficiency for energy storage. Therefore, the presence of the passive substrate for fabricating passive optoelectronic devices may achieve the purpose of reducing losses and improving system efficiency.

In this case, the active chip 210-1 and the passive chip 210-2 may be coupled directly (see FIG. 2A) or may be coupled via spot-size converters (see FIG. 2B). As shown in FIG. 2B, when the active chip 210-1 and the passive chip 210-2 are coupled via the spot-size converters 215-1 and 215-2, the spot-size converters 215-1 and 215-2 may also be fabricated on the active substrate. At this time, the spot-size converter 215-1 can be configured to receive an output from the laser assembly 211, perform spot-field matching between different substrates, and output a spot-field matched light to the mode selection device 212 fabricated on the passive substrate. The spot-size converter 215-2 can be configured to receive an optical signal from the optical delay module 213, perform spot-field matching between the substrates and output a spot-field matched light to the detector 214. Such a design may further reduce optical loss of the optoelectronic oscillator and improve the efficiency.

It can be seen that the optoelectronic oscillator according to the example embodiment shown in FIGS. 2A and 2B is capable of reduce loss and improve the efficiency of the optoelectronic oscillator, compared to the optoelectronic oscillator according to the example embodiment shown in FIG. 1.

Figure 3:
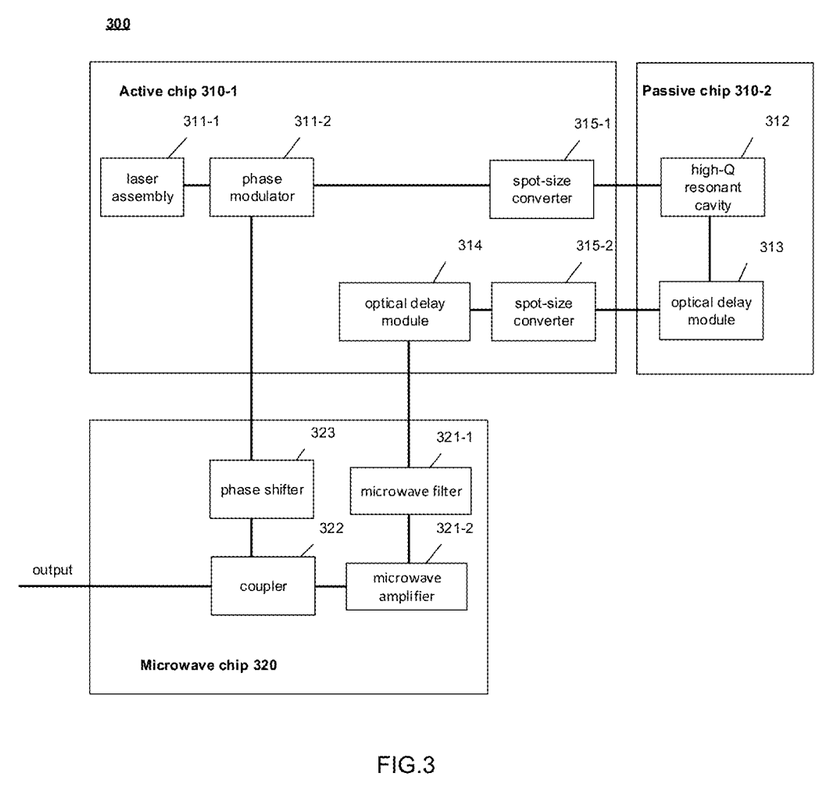
FIG. 3 illustrates a structural block diagram of an optoelectronic oscillator in accordance with an example of example embodiments of the present disclosure.

FIG. 3 illustrates a structural block diagram of an optoelectronic oscillator in accordance with an example of example embodiments of the present disclosure. In the example shown in FIG. 3, an optical chip 310 may include an active chip 310-1 such as indium phosphide and a passive chip 310-2 such as silicon nitride.

As shown, the laser assembly is implemented as a distributed feedback laser 311-1 and a phase modulator 311-2. The distributed feedback laser 311-1 emits a single mode laser under the driving of direct current. An emitted laser is transmitted to the phase modulator 311-2 for phase modulation. A phase-modulated light then enters a first spot-size converter 315-1 for spot-size conversion and is coupled to the passive chip 310-2 subsequently. The high-Q resonant cavity 312 receives a spot-size converted light and suppresses sidebands of the light, so as to achieve the mode selection. Subsequently, a mode selected light passes through an optical delay module 313 such as a spiral waveguide for energy storage. Thus, the light is stored and then coupled into a second spot-size converter 315-2 on the active chip 310-1 for spot-size conversion. Thereafter, the optical signal is received by the optoelectronic detector 314 for generating a microwave signal. The generated microwave signal is transmitted to a microwave chip 320 through a high-frequency microstrip line. In particular, the generated microwave signal passes through a microwave filter 321-1 (e.g, a band-pass microwave filter) to suppress out-of-band noise, and passes through a microwave amplifier 321-2 to amplify the power of the microwave signal. After that, a part of the microwave signal is output via a coupler 322, and the other part of the microwave signal is provided to a phase-shifter 323 via the coupler 322, in order to be further loaded to the phase modulator 311-2 for feedback after being phase-shifted.

Figure 4:
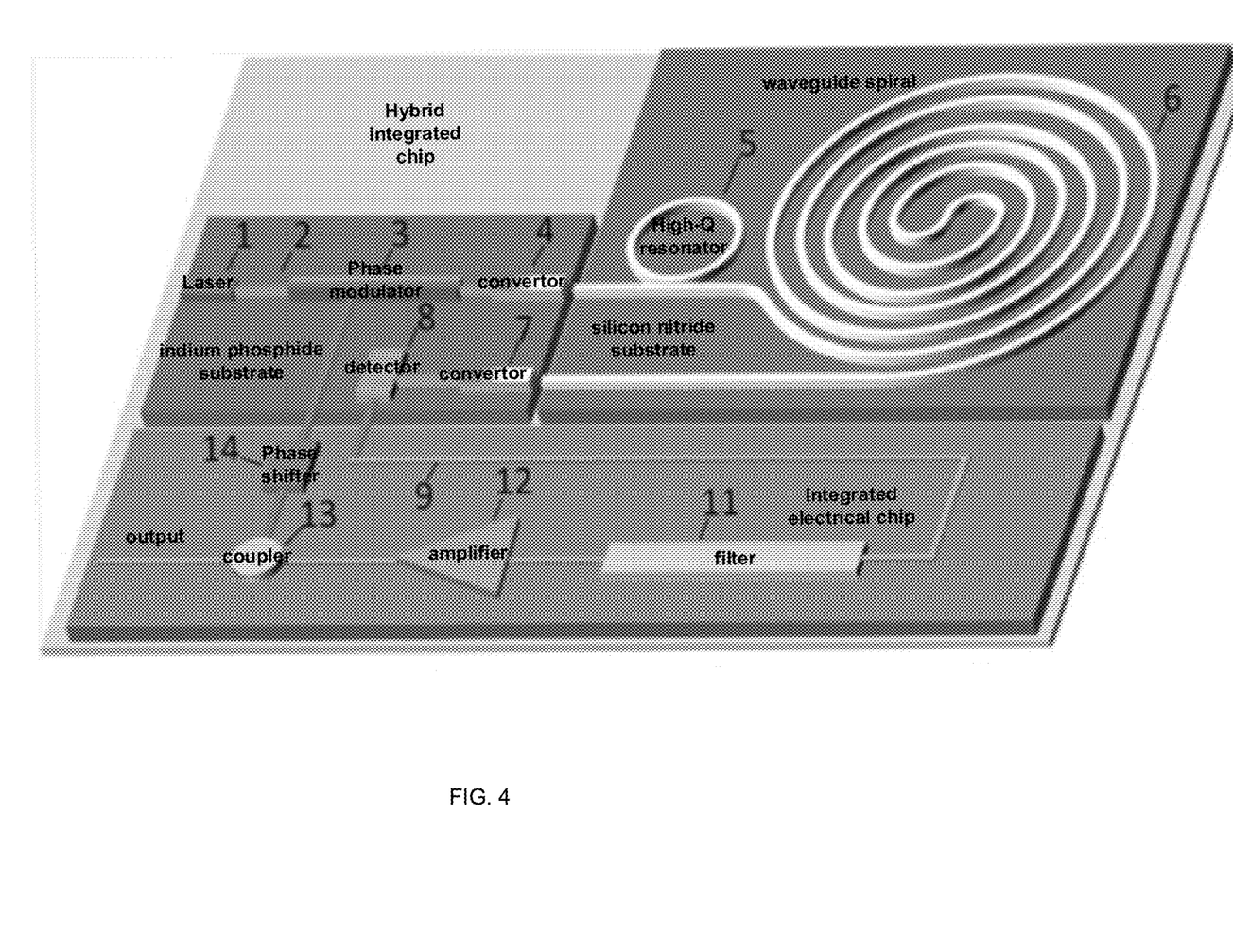
FIG. 4 illustrates a schematic diagram of an optoelectronic oscillator in accordance with an example embodiment of the present disclosure.

FIG. 4 is a schematic diagram illustrating the optoelectronic oscillator as shown in FIG. 3.

As shown in FIG. 4, an optoelectronic oscillator according to an example embodiment of the present disclosure may include: an indium phosphide chip, a silicon nitride chip, and a microwave chip. The indium phosphide chip includes a distributed feedback laser 1, an indium phosphide waveguide 2, an electro-optical phase modulator 3, a first spot-size converter 4, a second spot-size converter 7 and an optoelectronic detector 8. The silicon nitride chip includes a high-Q microring resonant cavity 5 and a waveguide spiral 6. The microwave chip includes a high-frequency microstrip line 9, a microwave filter 11, a microwave amplifier 12, an electrical coupler 13 and a phase shifter 14.

In a specific embodiment, the distributed feedback laser 1 has a single mode output having a center wavelength of 1550 nm, and the wavelength can be tuned with a range of 4 nm under the injection current. The output power reaches up to 3 dBm.

The indium phosphide waveguide 2 is a typical single mode waveguide, which is mainly used for connecting various optoelectronic devices on the indium phosphide chip, and has a loss of about 2.5 dB/cm.

The electro-optical phase modulator 3 is integrated on the indium phosphide chip and configured to modulate the optical signal base on electro-optic effect. The electro-optical phase modulator 3 may have a bandwidth response of about 0-20 GHz with a loss lower than about 6 dB.

The first spot-size converter 4 and the second spot-size converter 7 can be configured to match the spot-field between the indium phosphide waveguide and the silicon nitride waveguide, and each has a coupling loss less than about 1.5 dB.

The high-Q microring resonant cavity 5 may have a Q-value up to about $10^7$ and a free spectral range greater than 40 GHz, which is mainly used for suppressing the sidebands of the phase modulated signal, so as to achieve a conversion form phase modulation to intensity modulation.

The waveguide spiral 6 has a length equal to or greater than 2 m, and more preferably, greater than 3 m. The waveguide spiral 6 is capable of reducing the microwave noise generated by the chip significantly, and is characterized in low loss, in particular, having a loss of about 0.5 dB/m or less than 0.5 dB/m.

The optoelectronic detector 8 can be integrated on the indium phosphide chip, and has a bandwidth greater than 20 GHz and a responsiveness of about 0.9 NW.

The high-frequency microstrip line 9 is mainly used for connecting the indium phosphide chip with the microwave chip, enabling the transmission of microwave signal generated by the optoelectronic detector on the microwave chip.

For example, the high-frequency microstrip line 9 supports a signal bandwidth up to about 20 GHz.

The microwave filter 11 may be a band-pass filter that performs a band-pass filtering on the generated microwave signal, e.g., suppresses signals outside the band of about 2-18 GHz, for improving the quality of the microwave signal. In one example, the microwave filter 11 can have an out-of-band suppression ratio of about 25 dB.

The microwave amplifier 12 can amplify the power of the microwave signal, such that a significant strong microwave signal can be output and the microwave signal fed to the phase modulator is sufficient enough for phase modulation. For example, the microwave amplifier 12 may have a gain of about 15 dB and a bandwidth of 20 GHz accordingly.

The phase shifter 14 is used for adjusting the phase of the microwave signal during transmission, so that the microwave signal is better matched with the length of the optoelectronic loop, thereby further improving the efficiency.

The electrical coupler 13 splits the amplified microwave signal, wherein a part of the microwave signal is loaded to the phase modulator as a feedback modulation signal, and the other part is output as the resulting microwave signal, which has a low phase noise.

Thus, the optoelectronic loop composed of the indium phosphide chip, the silicon nitride chip and the microwave chip as discussed above is a feedback loop with mode selection mechanism, which can generate a 2-18 GHz tunable microwave signal with a phase noise of about −90 dBc/Hz@10 kHz.

It can be seen that the optoelectronic oscillator discussed above may have a small size and a light weight, a reduced power consumption and a high reliability due to the hybrid integration. Further, the microwave signal outputted by the optoelectronic oscillator may have a tunable frequency by introducing a tunable distributed feedback laser, an electro-optic phase modulator and a high-Q microring resonator. In addition, a microwave output with a low phase noise, for example, as low as −90 dBc/Hz@10 kHz, may be achieved by introducing the waveguide spiral into the oscillator.

Thus, the embodiments of the present disclosure have been described in detail in conjunction with the accompanying drawings. It should be noted that the implementations that are not described in the drawings or the specification are all known to those of ordinary skill in the art and are not described in detail. Moreover, the above definitions of the various elements and methods are not limited to the specific structures, shapes or manners mentioned in the embodiments, and those skilled in the art can make changes or substitutions to them. For example, the high-Q microring resonator may be replaced with other optical devices having mode selection mechanism, such as a grating. In addition to the above mentioned microwave filter and microwave amplifier, the microwave processing circuit can further include other microwave devices, such as attenuators, phase shifters, without departing from the scope or sprite of the inventive concept. Furthermore, the number of microwave filters and microwave amplifiers may also not be limited to the number shown in the figures, which may include more or fewer filters or amplifiers. That is, the attached drawings are simplified and used as an illustration, and the number, shape, and size of the devices shown in the drawings may be modified according to actual requirements, and the configuration of the devices may be more complicated.

In summary, according to the embodiments of the present disclosure, due to the on-chip hybrid integration, it is possible to reduce the weight and size of the optoelectronic oscillator, and simplify the complicated peripheral power supply system, which is more advantageous for large-scale applications.

Besides, it should be noted that the numerical parameters in the specification and the appended claims are approximations and can be varied based on the desired characteristics obtained by the teachings of the disclosure. In particular, all numbers expressing the composition contents, reaction conditions, and the like, which are used in the specification and claims, are to be understood as being modified by the term "about" in all cases. In general, the meaning of its expression refers to encompass a variation of ±10% by a particular amount in some embodiments, a variation of ±5% in some embodiments, a variation of ±1% in some embodiments, and a variation of ±0.5% in some embodiments.

Further, the word "comprising" does not exclude the presence of the elements or the steps that are not recited in the claims. The word "a" or "an" before an element does not exclude the existence of multiple such elements.

The use of ordinal numbers such as "first," "second," "third," and the like in the description and the claims is to modify a corresponding element, and do not mean that the elements have any ordinal numbers. They do not represent the order of one element and another element, or the order of the method of manufacture. They are only used to distinguish one element with a certain name from another element with the same name clearly.

Similarly, it should be understood that various features of the disclosure are sometimes grouped together into a single embodiment, figure or description in describing the above exemplary embodiments of the disclosure, so as to simplify the present disclosure and facilitate in understanding one or more of various disclosed aspects. However, the method disclosed is not to be interpreted as reflecting the intention that the claimed disclosure requires more features than those recited in the claims. Rather, as disclosed in the following claims, the disclosed aspects are less than all features of the single embodiment disclosed herein. Therefore, the claims following the specific embodiment are hereby explicitly incorporated into the embodiments, and each of the claims being a separate embodiment of the disclosure itself.

The purpose, technical solution and beneficial effect of the disclosure are further explained in detail by the specific embodiments described above. It should be understood that the above description is only specific embodiments of the disclosure and is not intended to limit the disclosure, any modifications, equivalent substitutions or improvement without departing from the spirit of the disclosure should be included within the scope of the present disclosure.

We claim:

1. An optoelectronic oscillator, comprising:
   an optical chip, implemented by fabricating different optoelectronic devices on an integrated optical material substrate, the optoelectronic device comprises:
   a laser assembly, configured to emit a laser;
   a mode selection device, coupled to the laser assembly, and configured to receive the laser from the laser assembly and perform mode selection on the laser;
   an optical delay module, coupled to the mode selection device, and configured to receive a mode selected light from the mode selection device so as to store the light; and
   a detector, coupled to the optical delay module, and configured to receive the stored light from the optical delay module and generate microwave signal according to the light received, and a microwave chip, implemented by fabricating microwave elements on a semiconductor material substrate, comprising:

a microwave processing circuit, configured to receive the microwave signal from the detector and process the microwave signal;

a coupler coupled to the microwave processing circuit, and configured to receive a processed microwave signal from the microwave processing circuit, provide a part of the processed microwave signal to a phase shifter and output the other part of the processed microwave signal; and the phase shifter, coupled to the coupler, and configured to receive and phase-shift the part of the processed microwave signal from the coupler, and feed a phase-shifted microwave signal, so as to the laser assembly to modulate the laser emitted by the laser assembly, wherein the optical delay module is a waveguide spiral having a length being longer than 2 m.

2. The optoelectronic oscillator of claim 1, wherein the length of the waveguide spiral is 3 m.

3. The optoelectronic oscillator of claim 1, wherein the laser assembly is implemented as a laser equipped with a microwave interface, which is configured to receive the phase-shifted microwave signal from the coupler, and modulate an output of the laser according to the phase-shifted microwave signal.

4. The optoelectronic oscillator of claim 1, wherein the laser assembly is implemented as a laser and a modulator coupled to the laser, the modulator is configured to receive the phase-shifted microwave signal from the coupler, and modulate an output of the laser according to the phase-shifted microwave signal.

5. The optoelectronic oscillator of claim 4, wherein the laser is a distributed feedback laser.

6. The optoelectronic oscillator of claim 5, wherein the distributed feedback laser has a single mode output with a wavelength of 1550 nm, and the wavelength is tunable with an injection current and has a tunable range of 4 nm.

7. The optoelectronic oscillator of claim 1, wherein the integrated optical material substrate comprises an active substrate, and wherein the laser assembly, the mode selection device, the optical delay module and the detector are fabricated on the active substrate.

8. The optoelectronic oscillator of claim 1, wherein the integrated optical material substrate comprises an active substrate and a passive substrate, and wherein the laser assembly and the detector are fabricated on the active substrate, and the mode selection device and the optical delay module are fabricated on the passive substrate.

9. The optoelectronic oscillator of claim 7, wherein the active substrate is an indium phosphide substrate.

10. The optoelectronic oscillator of claim 8, wherein the passive substrate is a silicon nitride substrate.

11. The optoelectronic oscillator of claim 8, further comprises a spot-size converter fabricated on the active substrate and configured to perform a spot-size conversion between different substrates.

12. The optoelectronic oscillator of claim 1, further comprises a microstrip line, and wherein the microwave chip is connected to the optical chip through the microstrip line.

13. The optoelectronic oscillator of claim 1, wherein the microwave processing circuit comprises a microwave filter and a microwave amplifier, wherein the microwave filter is configured to filter the microwave signal and the microwave amplifier is configured to amplify the microwave signal.

14. The optoelectronic oscillator of claim 1, wherein the mode selection device comprises one of a high-Q resonant cavity and a grating.

15. The optoelectronic oscillator of claim 8, wherein the active substrate is an indium phosphide substrate.

\* \* \* \* \*